United States Patent [19]

Collison et al.

[11] Patent Number: 4,757,519
[45] Date of Patent: Jul. 12, 1988

[54] DIGITAL PREMODULATION FILTER

[75] Inventors: Robert R. Collison, Veradale; Michael T. Wende; Raymond A. Birgenheier, both of Spokane, all of Wash.

[73] Assignee: Hewlett-Packard, Palo Alto, Calif.

[21] Appl. No.: 104,201

[22] Filed: Oct. 2, 1987

[51] Int. Cl.$^4$ .............................................. H03C 3/08
[52] U.S. Cl. ........................................ 375/60; 375/17; 375/62; 375/67; 332/1; 455/93
[58] Field of Search ........................ 375/17, 42, 46, 59, 375/60, 62, 67; 332/1; 455/93; 364/724

[56] References Cited

U.S. PATENT DOCUMENTS

| | | | |
|---|---|---|---|
| 3,590,384 | 6/1971 | Van Gerwen | 455/93 |
| 3,958,191 | 5/1976 | Jones Jr. | 332/1 |
| 4,003,001 | 1/1977 | Jones Jr. | 332/1 |
| 4,686,490 | 8/1987 | Cressy | 332/1 |

Primary Examiner—Benedict V. Safourek
Attorney, Agent, or Firm—Leslie G. Murray

[57] ABSTRACT

A programmable premodulation filter having a finite impulse response to digitally filter a digital data signal to provide a modulation signal for modulating an RF carrier signal is described. A digital summer and accumulator are programmed to provide a finite impulse response to a bimodal impulse signal which represents the input digital data signal. Several impulse response functions g(t) are stored in a ROM (or RAM) and may be selected to reprogram the digital filter to provide a desired modulation format. When a RAM is used, additional impulse response functions may be input to the RAM and the stored impulse response functions may be dynamically modified to provide the desired modulation format.

17 Claims, 6 Drawing Sheets

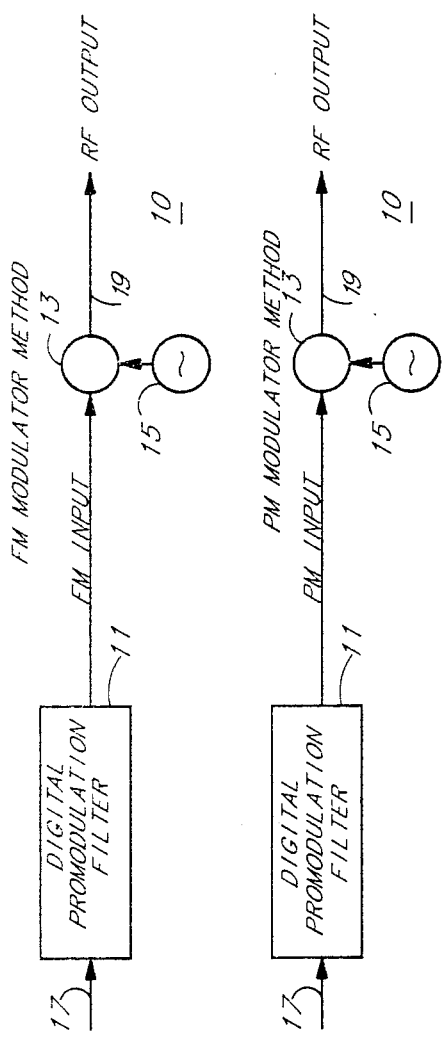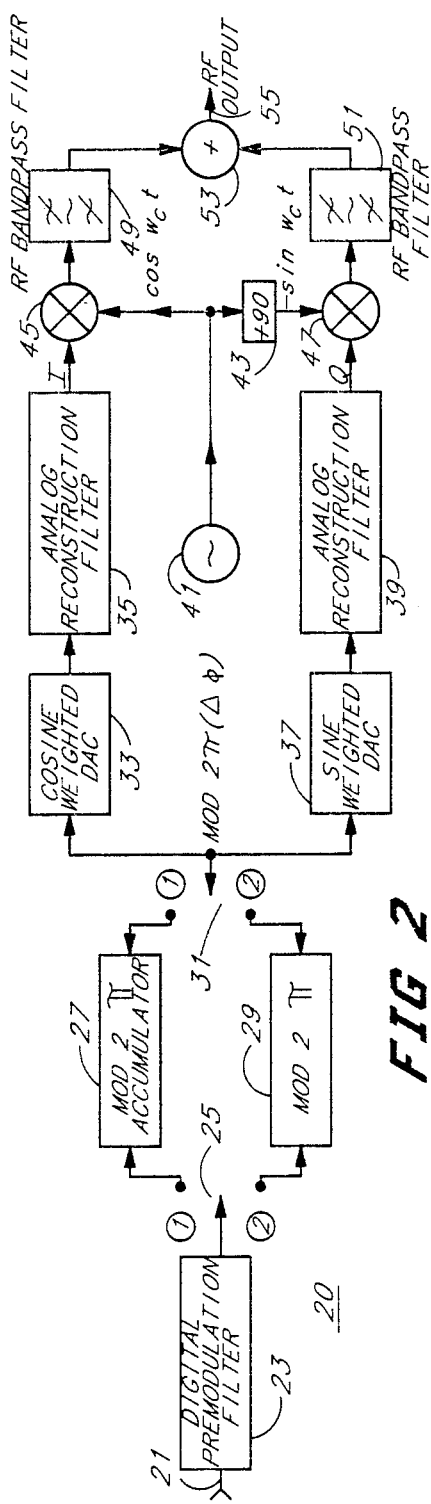
FIG 1A  FIG 1B  FIG 2

DIGITAL PREMODULATION FILTER

BACKGROUND OF THE INVENTION

The present invention relates generally to transmitters for transmitting angle modulated signals, and, more particularly, to a digital premodulation filter for conditioning a serial bit stream prior to frequency (or phase) modulation of a RF carrier signal.

For radio communication constant-envelope frequency modulation signals are preferable due to existing system constraints in power economy and the high efficiency amplification available with non-linear power amplifiers. A disadvantage of frequency modulation (FM) is however that the spectrum is rather wide. A solution is to use spectrally efficient modulation to maximize the bandwidth efficiency, measured in bits/-second/Hz. A method for achieving spectrally efficient modulation is to shape the data at the input of the frequency modulator by means of a premodulation filter. Such a premodulation filter is described in the article "Tamed Frequency Modulation, A Novel Method to Achieve Spectrum Economy in Digital Transmission" by F. deJager and C. B. Dekker, published in "IEEE Transactions on Communications" Vol. Com. 26 No. 5, May, 1978. The modulation described in this article relates to what is commonly referred to as tamed frequency modulation (TFM).

U.S. Pat. No. 4,477,916 entitled "Transmitter for Angle—Modulated Signals" issued to Kah-Seng Chung on Oct. 16, 1984, discloses an FM transmitter having a premodulation filter to shape an input data signal in a predetermined manner. The premodulation filter comprises a Gaussian low-pass filter and a correction filter. The latter filter comprises a cascade of 2n delay sections, each having a time delay of T seconds. The output of the premodulation filter is connected to the signal input of a frequency modulation circuit to provided the modulated output as desired.

U.S. Pat. No. 4,531,221 entitled "Premodulation Filter For Generating A generalized Tamed Frequency Modulated Signal", issued to Kah-Seng Chung and Leo E. Zegers on July 23, 1985 discloses a transmitter having a premodulation filter arranged to provide a substantially three-level signal at the sampling instants $t = (2m-1)T/2$, wherein T is the symbol duration of the data signals and m is an integer. The premodulation filter comprises the series arrangement of a non-recursive second order digital filter with three weighing factors, two of which are equal to each other, and a low pass filter realized by means of a "raised cosine" filter which satisfies the first Nyquist criterion. The mutually unequal weighting factors have the values A and B, the value of the weighting factor A and, respectively of the non-recursive second order filter being less than one-fourth and larger than one-half, respectively, $2A+B$ being equal to one and the roll off coefficient of the "raised cosine" filter being unequal to zero.

The above-mentioned prior art transmitters utilize premodulation filter circuits comprising analog filters or a combination of digital and analog filters to provide carrier modulation dedicated to a single modulation type; TFM, for example.

SUMMARY OF THE INVENTION

It is an object of the present invention to provide a digital premodulation filter circuit for generating various forms of continuous phase modulation (CPM). Examples of such CPM are minimum shift keying (MSK), Gaussian minimum shift keying (GMSK), tamed frequency modulation (TFM) and four-level FM (4-FM) and additional modulation methods which a user may define. The premodulation filter of the present invention is electronically configurable by a user to perform a desired modulation type, thus providing a more versatile instrument than previous methods which are typically dedicated to a single modulation type.

According to the present invention, the premodulation filter utilizes a finite impulse response filter (FIR) technique to digitally filter an input serial bit data stream. Each modulation format, such as TFM, has a unique impulse response function g(t) which is the response to a single input data bit represented by a single impulse function. The premodulation filter preforms a linear combination of g(t) responses resulting from the input data stream represented by a series of bimodal impulse functions. The output of FIR digital filter in the form of parallel digital words is coupled to a digital to analog converter (DAC). The output of the DAC is then passed through an analog filter to provide a smooth analog voltage input to a modulator to vary, for example, the frequency or phase of an oscillator, such as a voltage controlled oscillator (VCO) to provide a digitally modulated carrier output.

The prior art premodulation filters described hereinabove are typically dedicated to a single digital modulation format and are not easily user configurable. In the premodulation filter of the present invention a number of frequency or phase pulse-shape function g(t) arrays are stored in ROM (or RAM) allowing the user to easily choose any desired modulation format. A user may adjust operational parameters to optimize further performance or to design a custom modulation format for use with a users particular digital communication system. Further, prior art digital premodulation FIR filters typically utilize multiplication in the convolution process whereas the present invention utilizes an adder thus providing a speed advantage over the prior art.

BRIEF DESCRIPTION OF THE DRAWINGS

FIGS. 1a and 1b are block diagrams illustrating an RF transmitter utilizing FM modulation and of an RF transmitter utilizing phase modulation.

FIG. 2 is a block diagram illustrating an RF transmitter utilizing I-Q modulation.

DETAILED DESCRIPTION OF THE PREFERRED EMBODIMENT

Figure 3:
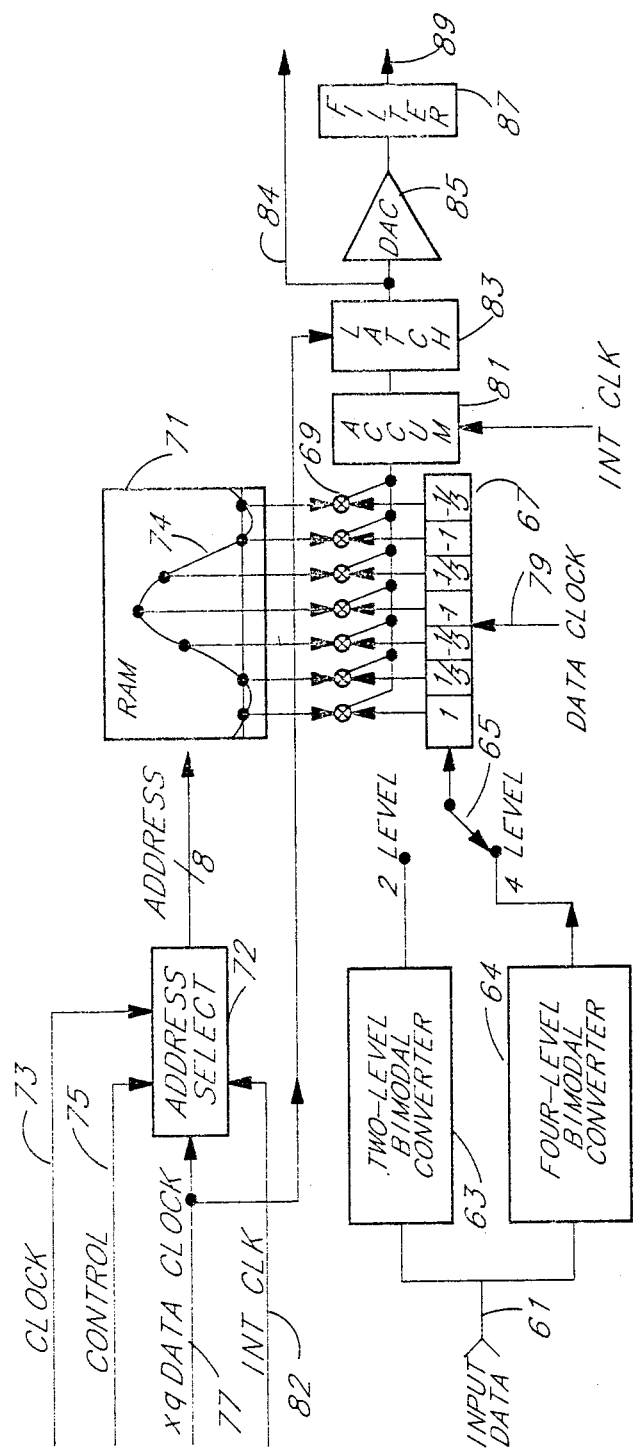
FIG. 3 is a block diagram illustrating a conceptual representation of a FIR digital premodulation filter according to the principals of the present invention.

The method and apparatus described herein utilizes a Finite Impulse Response (FIR) technique to digitally filter an input data signal. The FIR digital premodulation filter is programmable by the user to generate various modulation signals corresponding to several different types of frequency modulation (FM) and phase modulation (PM). Each modulation type or format has a unique impulse response function g(t) which is the response to a single input data impulse. The FIR digital premodulation filter performs a convolution utilizing a linear combination of g(t) responses resulting from the input data stream. The input to the FIR digital premodulation filter is in the form of a bimodal impulse stream which represents the input data.

Referring now to FIGS. 1A and 1B, a block diagram illustrating a portion 10 of a signal generator which provides a frequency modulated RF carrier signal is shown. It comprises a digital premodulation filter 11 having an input line 17 for receiving a data signal, and an RF carrier generator 15 coupled to a frequency modulator 13. By means of the digital premodulation filter 11, which will be described in greater detail, an analog modulation signal is generated. This modulation signal is coupled to the modulator 13 to frequency modulate the RF carrier signal supplied by the RF carrier generator 15. The FM RF output signal thus formed by modulator 13 is output on line 19.

FIG. 1A represents a frequency modulation system wherein the FIR function g(t) utilized by the digital premodulation filter 11 represents the instantaneous frequency deviation of the RF carrier output signal on line 19 resulting from a single impulse function and can be termed a "frequency pulse shape function". Similarly, FIG. 1B represents a phase modulation system wherein the FIR function g(t) utilized by the digital premodulation filter 11 represents the instantaneous phase deviation of the RF carrier output signal on line 19 resulting from a single impulse function and can be termed "phase pulse shape function".

Referring now to FIG. 2, a multiple-phase modulation system 20 including an inphase (I) channel and a quadrature (Q) channel (I-Q modulator) is shown. As described for FIGS. 1A and 1B, FIR digital premodulation filter 23 may be programmed to generate a desired type of modulation wherein g(t) will represent either the instantaneous frequency or phase deviation of the RF output signal resulting from a single impulse function, depending on whether FM or PM operation is used. A input data stream on line 21 is coupled to the FIR digital premodulation filter 23 which performs a convolution utilizing a linear combination of g(t) responses and outputs a signal in the form of parallel digital words.

In the case of FM operation, the output of the FIR digital premodulation filter 23 is coupled via switch 25 to a modulo 2 PI transform network and accumulator 27 to transform the instantaneous frequency deviation to an instantaneous phase deviation. The accumulator 27 output is coupled via switch 31 to a cosine-weighted DAC 33 and an analog reconstruction filter 35 to provide the analog signal for the I channel modulator 45. Similarly, the accumulator 27 output signal is coupled to a sine-weighted DAC 37 and analog reconstruction filter 39 to provide the analog signal to the Q channel modulator 47.

In the case of the PM operation, the output of the FIR digital premodulation filter 23 is coupled to a modulo 2 PI transform network 29 to provide the modulation signal representing instantaneous phase deviation. As described hereinabove, the transform network 29 output signal is coupled via switch 31 to the I channel and Q channel modulators 45 and 47, respectively. The RF carrier signal generated by RF frequency source 41 is coupled to both I and Q channel modulators 45, 47 to be modulated in a conventional manner and provide an RF output signal on line 55 at the output of adder 53.

Referring now to FIG. 3, a schematic drawing which illustrates a conceptual representation of the classical convolution operation of the FIR digital premodulation filter of FIGS. 1 and 2 is shown. A serial logic level input data stream on line 61 is converted to binary numbers by converter 63 and converter 64. The value of each binary number represents the magnitude and sign of a corresponding bimodal data impulse.

Converter 63 performs the conversion for two-level modulation formats such as MSK, GMSK, and TFM. In two-level modulation, as shown in Table 1, a logical 1 input data bit may be represented by a binary number of value 1 (base 10) which corresponds to a bimodal data impulse of value +1. A logical 0 data bit may be represented by a binary number of value −1 (base 10) which corresponds to a bimodal data impulse of value −1.

TABLE 1

| Two-Level Conversion | |
|---|---|
| Logical Level Input Data Bit | Value Binary Number (base 10) |
| 0 | −1 |
| 1 | 1 |

Converter 64 performs the conversion for four-level level modulation formats such as 4-FM. In four-level modulation, pairs of serial data bits are represented by binary numbers of value −1, −$\frac{1}{3}$, $\frac{1}{3}$ or 1 (base 10) which correspond to bimodal data impulses of values −1, −$\frac{1}{3}$, $\frac{1}{3}$, and +1 respectively. One example of such a conversion scheme is given in Table 2.

TABLE 2

| Four-Level Conversion | |
|---|---|
| Pairs of Serial Logical Level Input Data Bits | Value of Binary Number (base 10) |
| 00 | 1 |
| 01 | $\frac{1}{3}$ |
| 11 | −$\frac{1}{3}$ |
| 10 | −1 |

Switch 65 selects either two- or four-level operation. It is shown for illustration purposes in the four-level position and four-level binary numbers are present in shift register 67.

Curve 74 is a graphical representation of a selected one of several g(t) impulse response functions corresponding to different modulation formats stored as digital binary arrays in a ROM or RAM 71. A desired modulation format may be selected by a user via external control lines 75 coupled to the address block 72. The g(t) array values are stored for every T/q time period where T is the period of the data clock and q is a integer multiple: q=1, 2, 3, 4 . . .

The xq data clock 77 is phase locked to the data clock 73 with frequency of data clock 73*q.

The binary numbers which represent the input data stream (converted to a bimodal impulse format) are convolved with the stored binary numbers which represent the selected impulse response function g(t). The convolution involves multiplication of these binary number sequences in multiplier 69 and accumulation in accumulator 81. One convolution cycle occurs every xq clock cycle. During each convolution cycle, one multiply and accumulate operation takes place for each shift register 67 cell and corresponding stored g(t) binary number. The g(t) array values which are selected for each convolution cycle are separated via an addressing scheme by an amount which corresponds to a time interval of T. A multiply and accumulate operation occurs at every internal clock (INT CLK) 82 cycle. The INT CLK operates asynchronously with the xq data clock 77 at a rate much higher than the xq data clock 77 rate.

Latch 83 is clocked with each xq data clock 73 cycle to transfer the contents of the accumulator 81 to either DAC 85 or to the parallel digital output 84. The DAC provides an analog output signal at the output 89 via an analog reconstruction filter 87. After latch 83 is clocked, the selected addresses of the desired g(t) binary number array in ROM or RAM 71 are all incremented by an amount which corresponds to one subinterval T/q in time to start the next multiplication and accumulation cycle. This repeated operation performs the convolution.

Figure 4:
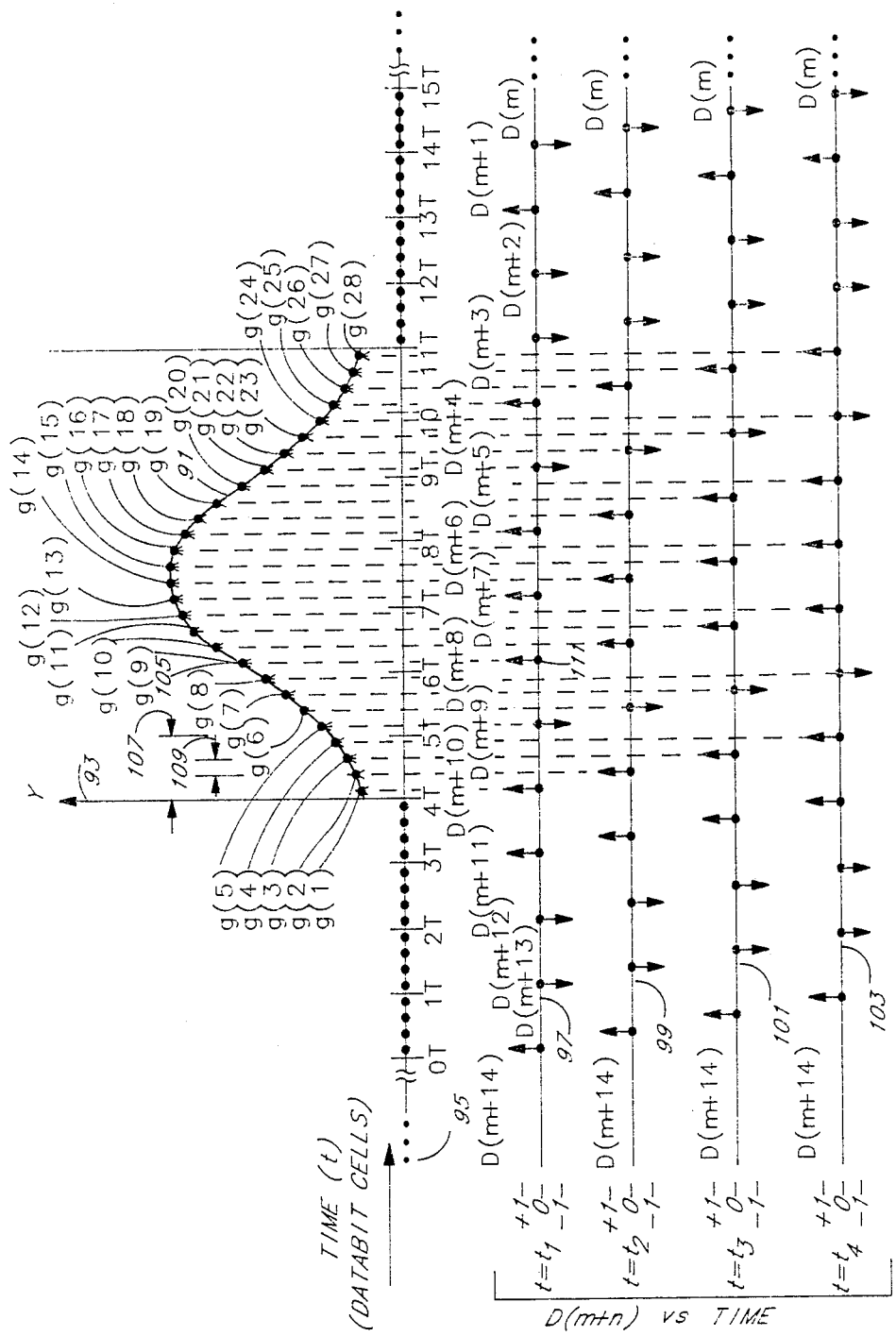
FIG. 4 is a graphical presentation of an example of a two-level digital modulation impulse response function g(t) and algorithm utilized in the apparatus shown in FIG. 6.
Figure 5:
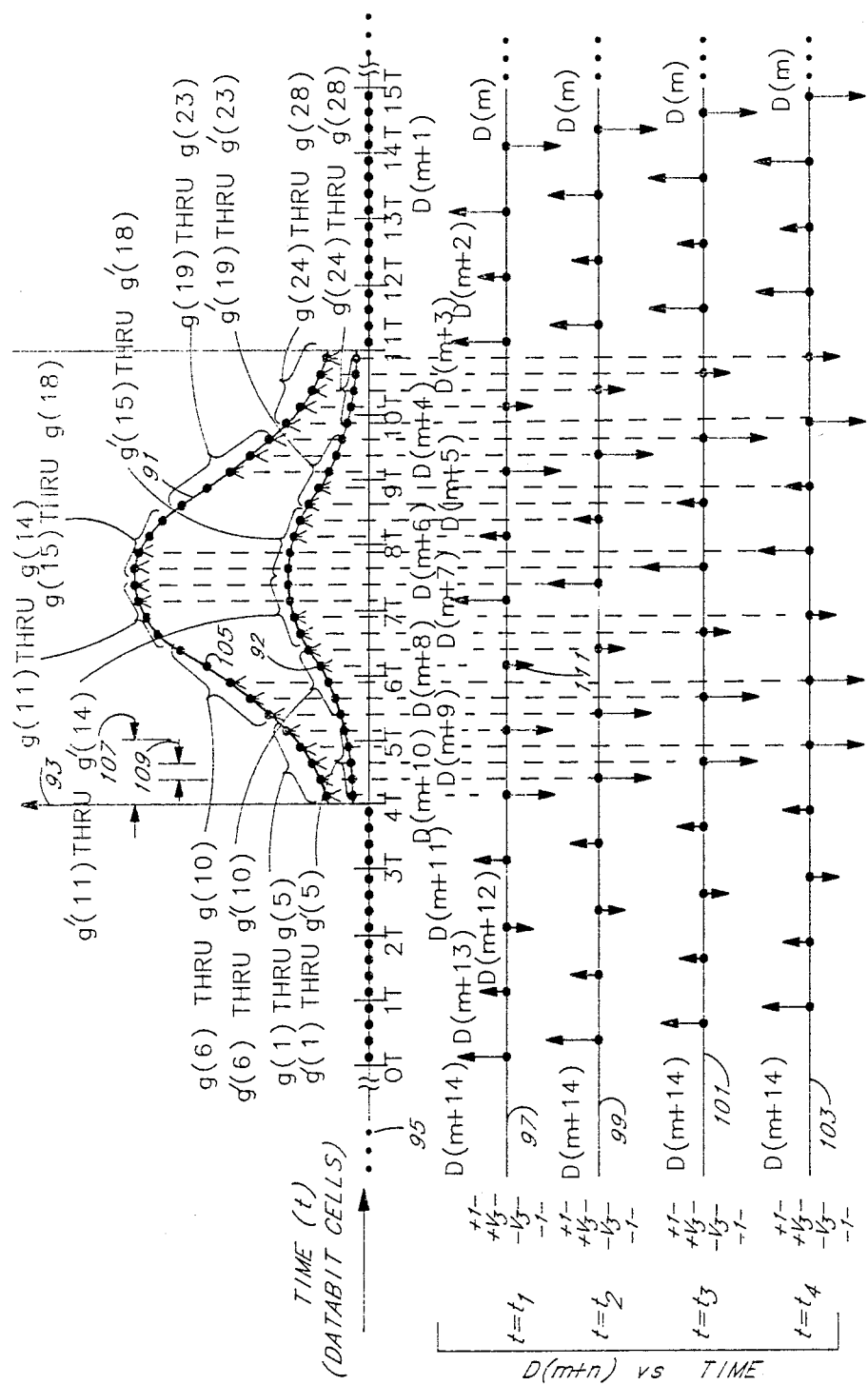
FIG. 5 is graphical representation of an example of a four-level digital modulation impulse response function g(t) and algorithm utilized in the apparatus shown in FIG. 7.

Referring now also to FIGS. 4 and 5, the selected g(t) impulse response function is stored as array of binary numbers in ROM or RAM 71 which represent samples of the continuous g(t) impulse response function 91. The y-axis 93 represents both the magnitude and sign of the continuous g(t) function 91 and the magnitude and sign of samples of the g(t) function 91 which are stored as binary numbers in ROM or RAM 71 (indicated in FIGS. 4 and 5 as discrete data points 105).

The x-axis 95 represents time (t) and is divided into units of data clock intervals (T). One data impulse occurs per each data clock interval T 107. Each data clock interval is further subdivided into q equal size data clock subintervals 109 per data clock interval T. The parameter q may take on values 1,2,3,4 . . . data clock subintervals/data clock interval. As previously described, the parameter q also determines the "xq" data clock 77 rate.

A binary number is stored in ROM or RAM 71 to represent the sampled value of the g(t) function for every data clock subinterval included in parameter L data clock intervals. The parameter L may take on values 1,2,3, . . . data clock intervals. The g(t) function may be symmetrically divided such that L*q/2 binary numbers are used to represent each of the upper and lower sides of the g(t) function relative to the maximum magnitude of the continuous g(t) function. Therefore, a total of L*q binary numbers which represent sampled values of the g(t) function are stored in ROM or RAM 71 for each two-level g(t) modulation format and 2*L*q binary numbers are stored for each four-level format. Outside +/−L/2 data clock intervals from the maximum, values of zero are assumed for g(t). The convolution algorithm does not operate on these zero values resulting in increased speed of execution.

For the examples illustrated in Tables 3, 4, 5 and 6 and FIGS. 4 and 5 the following parameters take on the indicated values:

q=4 data clock subintervals/data clock interval; and

L=7 data clock intervals.

Therefore, $L*q=28$ total binary array numbers representing the samples 105 of g(t) 91 are stored in ROM or RAM 71 as illustrated in FIG. 4 (two-level modulation format) and $2*L*q=56$ total binary array numbers representing the samples 105 of g(t) are stored in ROM or RAM 71 as illustrated in FIG. 5 (four-level modulation format). Above and below $+/-L/2=+/-3.5$ data clock intervals from the maximum value of g(t) 91, the value of g(t) and the binary numbers representing samples of g(t) are set to equal zero. In FIGS. 4 and 5, the maximum value of g(t) 91 occurs at 7.5 T.

For the two-level modulation format illustrated in FIG. 4, binary numbers are stored in an arrays in ROM or RAM 71 which represent samples 105 of the g(t) function 91. The organization of this array is indicated Table 3: (Where: t=time)

TABLE 3

Stored numbers=0 for 0T<t<4T data clock intervals

Stored numbers=g(t) for 4T<t<11T data clock intervals

Stored numbers=0 for 11T<t<15T data clock intervals

For the four-level modulation format illustrated in FIG. 5, two binary arrays of numbers are stored in ROM or RAM. The first array of binary numbers represents the set of samples 105 of the g(t) function 91 just as for two-level modulation formats. This organization of this array is indicated in Table 3. The second array of binary numbers g'(t) 92 represents the set of samples 105 scaled by $\frac{1}{3}$. The organization of the g'(t) 92 array is indicated in Table 4:

TABLE 4

| Stored numbers | = 0 for 0T < t < 4T data clock intervals |
| --- | --- |
| Stored numbers | = g'(t) for 4T < t < 11T data clock intervals<br>= g(t)*⅓ for 4T < t < 11T data clock intervals |
| Stored numbers | = 0 for 11T<t<15T data clock intervals |

Several arrays which represent selectable two- or four-level modulation formats may be stored in RAM or ROM 71. Each array has individual values of L and q assumed for the respective stored array values. Also, it is possible to choose g'(t) values which are scaled by an amount other than ⅓. For example, all g'(t) array members may be defined to be zero, in which case the four-level modulation degenerates into three-level modulation.

In the present invention, multiplications of stored binary numbers in ROM or RAM 71 which represent sampled g(t) values are not used in the convolution algorithm. Instead, additions or subtractions of the stored binary numbers in ROM or RAM 71 which represent either sampled g(t) values 105 or scaled samples of g(t) which are represented as g'(t) values 92 are used.

For two-level modulation formats, addition and subtraction of sampled g(t) values 105 provide the identical result as multiplication by +1 or −1 since the converted input bimodal data impulses have values of +1 or −1. Similarly, for four-level modulation formats, the addition or subtraction of the sampled g(t) values which are scaled by ⅓ (g'(t) array 92) provide the same result as multiplication of g(t) sampled values times the converted bimodal data impulses having values of +⅓ and −⅓, respectively.

Figure 6:
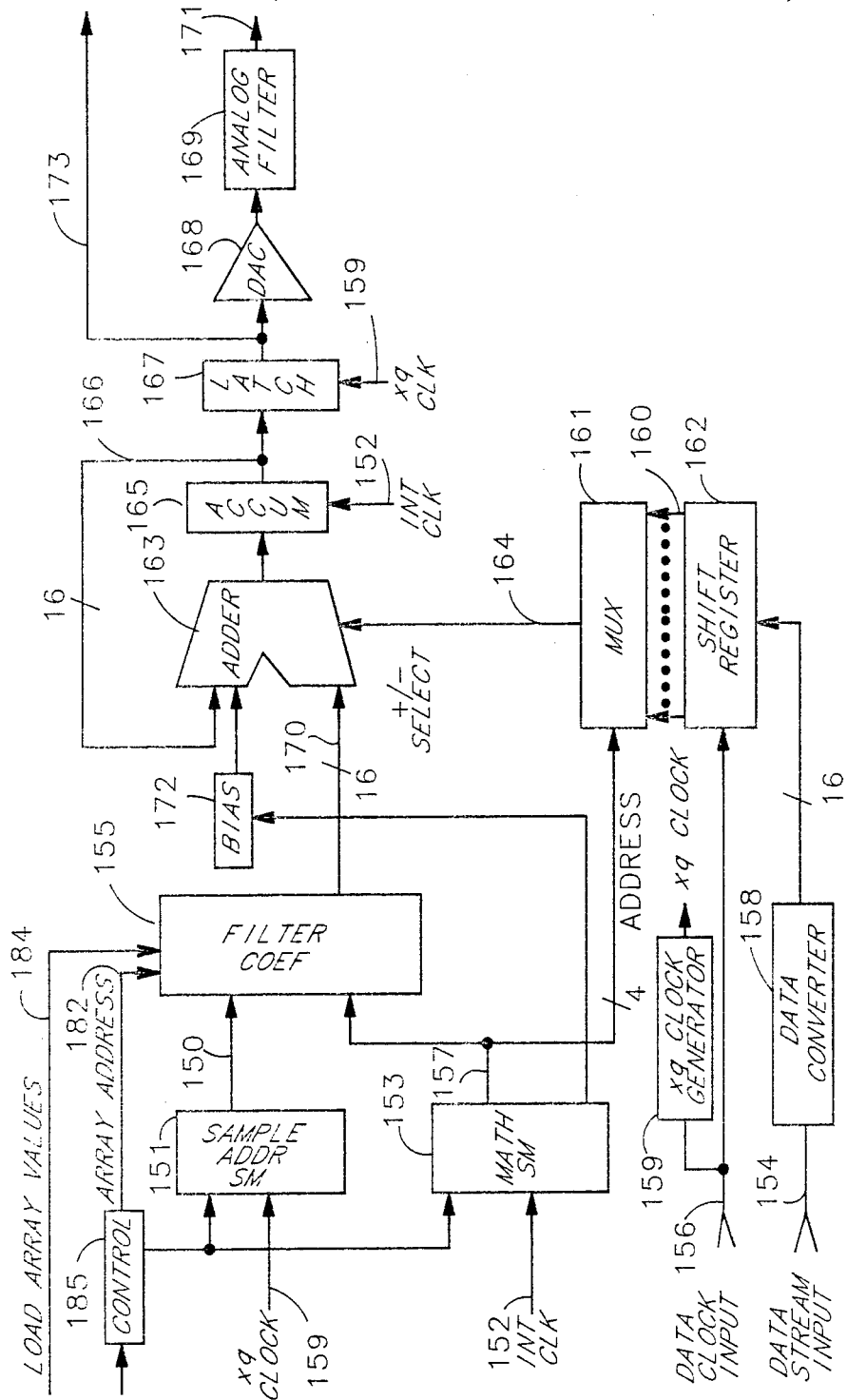
FIG. 6 is a block diagram illustrating the implementation of the FIR premodulation filter algorithm shown in FIG. 4 for two-level digital modulation.
Figure 7:
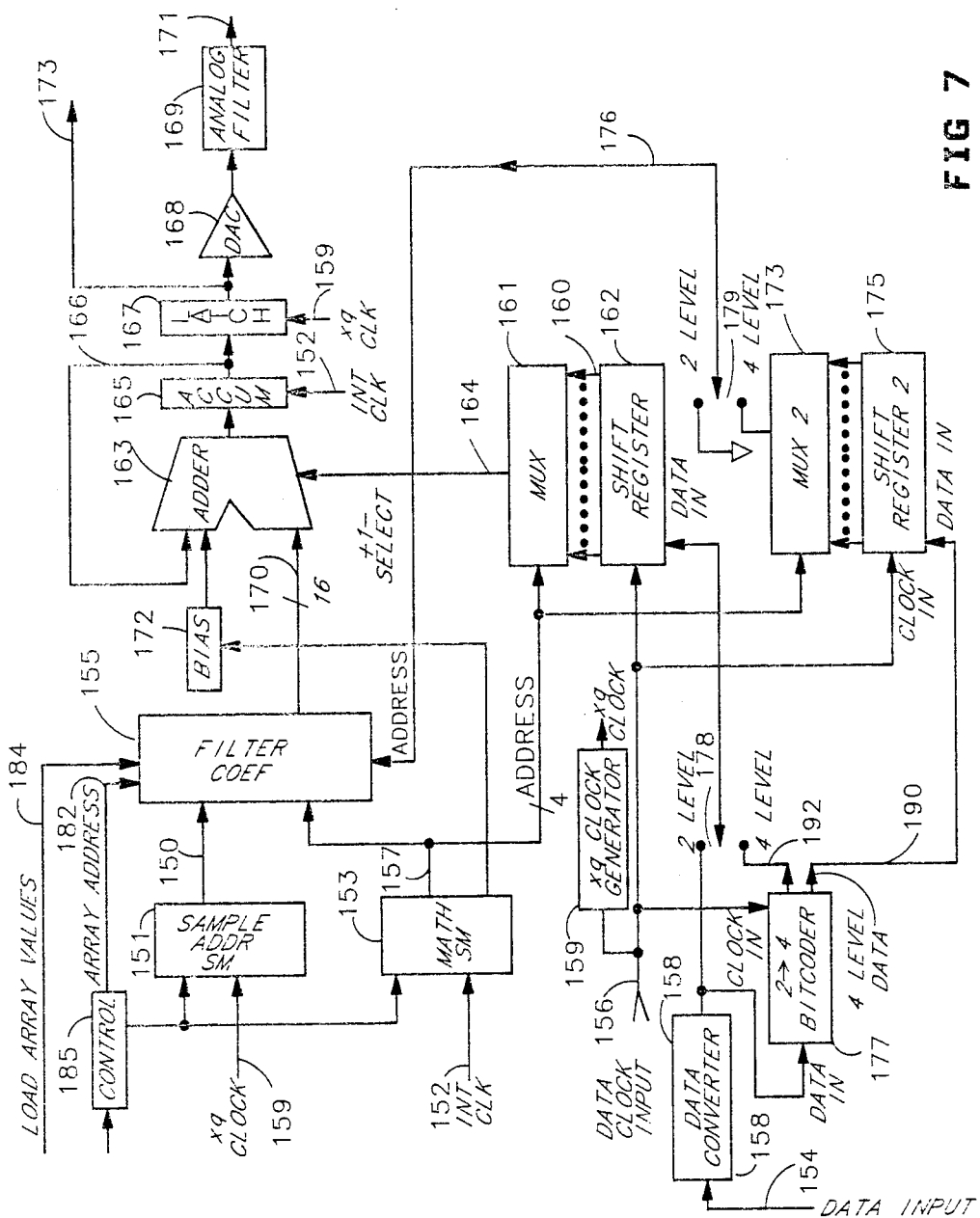
FIG. 7 is block diagram illustrating the implementation of the FIR premodulation filter algorithm shown in FIG. 5 for two-level or four-level digital modulation.

Table 5 illustrates an example of the two-level modulation format convolution algorithm which operates on the g(t) impulse function samples 105 that are depicted in FIG. 4. The corresponding hardware block diagram is illustrated in FIG. 6. Table 6 illustrates the four-level modulation format convolution algorithm which operates on the g(t) and g'(t) impulse samples 105 and 92 respectively that are depicted in FIG. 5. The corresponding hardware block diagram is illustrated in FIG. 7. Tables 5 and 6 contain both the convolution process equations for the conventional convolution method using multiplication and accumulation, and the equivalent convolution method used in the present invention using additions and subtractions. Accum(t) represents the numerical result of each convolution cycle which resides in the accumulator 165 after each convolution cycle (t=t1, t2, t3 . . .).

In Tables 5 and 6 and FIGS. 4 and 5, convolution cycles (data clock subinterval time periods) are given by t=t1, t2, t3 etc. D(m+n) indicates the value of a single bimodal data impulse function in the serial bimodal impulse data stream. Possible values for D(m+n) are +1 or −1 for two level modulation formats and +1, +⅓, −⅓, −1 for four level modulation formats. Parameter (m+n) is an index which represents the sequential position in time of each individual bimodel data impulse in the serial input data stream, Larger values of the index (m+n) indicate more recent data impulses. Parameter m is a reference index and parameter n is the sequential position of an individual bimodel data impulse relative to the reference index m.

TABLE 5

Two Level Modulation Format Convolution Algorithm Example

From FIG. 4, values of a portion of the bimodal data impulse stream are:
D(m) = −1
D(m++1) = +1
D(m++2) = −1
D(m++3) = −1
D(m++4) = +1
D(m++5) = −1
D(m++6) = +1
D(m++7) = +1
D(m++8) = +1
D(m++9) = −1
D(m++10) = +1
D(m++11) = +1
D(m++12) = −1
D(m++13) = −1
D(m++14) = +1

| Subinterval Period | Accumulator value |
|---|---|
| t1 | Accum(t1) = D(m +4) * g(1) |
| | + D(m+5) * g(5) |
| | + D(m+6) * g(9) |
| | + D(m+7) * g(13) |
| | + D(m+8) * g(17) |
| | + D(m+9) * g(21) |
| | + D(m+10) * g(25) |
| = g(1)−g(5)+g(9)+g(13)+g(17)+g(21)+g(25) | |
| t2 | Accum (t2) = D(m+4) * g(2) |
| | + D(m+5) * g(6) |
| | + D(m+6) * g(10) |
| | + D(m+7) * g(14) |
| | + D(m+8) * g(18) |
| | + D(m+9) * g(22) |
| | + D(m+10) * g(26) |
| = g(2)−g(6)+g(10)+g(14)+g(18)−g(22)+g(26) | |
| t3 | Accum(t3) = D(m+4) * g(3) |
| | + D(m+5) * g(7) |
| | + D(m+6) * g(11) |
| | + D(m+7) * g(15) |
| | + D(m+8) * g(19) |
| | + D(m+9) * g(23) |
| | + D(m+10) * g(27) |

TABLE 5-continued

Two Level Modulation Format Convolution Algorithm Example

| | |
|---|---|
| = g(3)−g(7)+g(11)+g(15)+g(19)−g(23)+g(27) | |
| t4 | Accum(t4) = D(m+4) * g(4) |
| | + D(m+5) * g(8) |
| | + D(m+6) * g(12) |
| | + D(m+7) * g(16) |
| | + D(m+8) * g(20) |
| | + D(m+9) * g(24) |
| | + D(m+10) * g(28) |
| = g(4)−g(8)+g(12)+g(16)+g(20)−g(24)+g(28) | |

After the above step, the data impulse stream index (m+n) is incremented by one and the process repeated:

| | |
|---|---|
| t5 | Accum(t5) = D(m+5) * g(1) |
| | + D(m+6) * g(5) |
| | + D(m+7) * g(9) |
| | + D(m+8) * g(13) |
| | + D(m+9) * g(17) |
| | + D(m+10) * g(21) |
| | + D(m+11) * g(25) |
| = −g(1)+g(5)+g(9)+g(13)−g(17)+g(21)+g(25) | |

The process is then repeated for t6, t7, and t8. The data impulse stream index (m+n) is again incremented by one and the process is repeated again for t9, t10, t11 and t12. This process is repeated continuously.

TABLE 6

Four-Level Modulation Format Convolution Algorithm Example

From FIG. 5, values of a portion of the bimodal data impulse streams are:
D(m) = −1
D(m+1) = +1
D(m+2) = +⅓
D(m+3) = +1
D(m+4) = −⅓
D(m+5) = −1
D(m+6) = +⅓
D(m+7) = +1
D(m+8) = −⅓
D(m+9) = −1
D(m+10)= −1
D(m+11)= +⅓
D(m+12)= −⅓
D(m+13)= +⅓
D(m+14)= +1

| Subinterval Period | Accumulator value |
|---|---|
| t1 | Accum(t1) = D(m+4) * g(1) |
| | + D(m+5) * g(5) |
| | + D(m+6) * g(9) |
| | + D(m+7) * g(13) |
| | + D(m+8) * g(17) |
| | + D(m+9) * g(21) |
| | + D(m+10) * g(25) |
| = −g'(1)−g(5)+g'(9)+g(13)−g'(17)−g(21)−g(25) | |
| t2 | Accum(t2) = D(m+4) * g(2) |
| | + D(m+5) * g(6) |
| | + D(m+6) * g(10) |
| | + D(m+7) * g(14) |
| | + D(m+8) * g(18) |
| | + D(m+9) * g(22) |
| | + D(m+10) * g(26) |
| = −g'(2)−g(6)+g'(10)+g(14)−g'(18)−g(22)−g(26) | |
| t3 | Accum(t3) = D(m+4) * g(3) |
| | + D(m+5) * g(7) |
| | + D(m+6) * g(11) |
| | + D(m+7) * g(15) |
| | + D(m+8) * g(19) |
| | + D(m+9) * g(23) |
| | + D(m+10) * g(27) |
| = −g'(3)−g(7)+g'(11)+g(15)−g'(19)−g(23)−g(27) | |
| t4 | Accum(t4) = D(m+4) * g(4) |
| | + D(m+5) * g(8) |

TABLE 6-continued

Four-Level Modulation Format Convolution Algorithm Example $$
\begin{aligned}
&+ D(m+6) * g(12) \\
&+ D(m+7) * g(16) \\
&+ D(m+8) * g(20) \\
&+ D(m+9) * g(24) \\
&+ D(m+10) * g(28) \\
= &-g'(4)-g(8)+g'(12)+g(16)-g'(20)-g(24)-g(28)
\end{aligned}
$$

After the above step, the data impulse stream index (m+n) is incremented by one and the process repeated:

$$
\begin{aligned}
t5 \quad Accum(t5) = \; & D(m+5) * g(1) \\
&+ D(m+6) * g(5) \\
&+ D(m+7) * g(9) \\
&+ D(m+8) * g(13) \\
&+ D(m+9) * g(17) \\
&+ D(m+10) * g(21) \\
&+ D(m+11) * g(25) \\
= &-g(1)-g'(5)+g(9)-g'(13)-g(17)-g(21)+g'(25)
\end{aligned}
$$

The process is then repeated for t6, t7, and t8. The data stream index (m+n) is again incremented by one and the process is repeated again for t9, t10, t11, and t12. This process is repeated continuously.

FIGS. 4 and 5 graphically illustrate the convolution algorithm for four convolution cycles (data clock subintervals t=t1, t2, t3, t4). The value of each data impulse function D(m+n) is indicated by an impulse symbol 111 on the D(m+n) versus time axes (97,99,101,103). Impulse symbols which point upward indicate positive values and impulse symbols which point downward indicate negative values. The length of each impulse symbol indicates its magnitude. The D(m+n) impulse data stream is sequentially moved to the right for each of the four convolution cycles by an amount which corresponds to one data clock subinterval 109. A dashed line connects each D(m+n) impulse 111 to a corresponding sampled g(t) or g'(t) array value 105, 92 which is added to or subtracted from the value in the Accum(t) 165 (as shown in FIGS. 6 and 7) once during each convolution cycle. Addition is used when the value of D(m+n) is positive and subtraction is used when the value of D(m+n) is negative.

In the conventional convolution algorithm, the numerical values which represent samples of g(t) are multiplied by corresponding values of D(m+n) and subsequently added to the accumulation, Accum(t). However, in the algorithm used in this invention, the sign (+1 or −1) of each D(m+n) determines whether the numerical values which represent discrete values of the g(t) impulse response 105 or g'(t) scaled impulse response 92 are added to or subtracted from Accum(t). For four-level formats, the absolute value (1 or ½) of D(m+n) determines whether numerical values used for the preceding addition or subtraction are addressed from the array which represents discrete values of g(t) 105 or from the array which represents discrete values of g'(t) 92.

FIG. 6 illustrates a detailed block diagram of the premodulation filter 11 of FIG. 1 implementing the two-level modulation algorithm illustrated in Table 5 and FIG. 4. Similarly, FIG. 7 illustrates a detailed block diagram of the premodulation filter 11 of FIG. 1 implementing the four-level modulation algorithm illustrated in Table 6 and FIG. 5.

The array members for each modulation format are stored in ROM (or RAM) 155. The g(t) array members are loaded into RAM 155 via data bus 184. Ram 155 has enough capacity to store several g(t) arrays for different modulation types. Several types of continuous phase modulation digital modulation formats may be programmed on a computer (not shown) and corresponding g(t) arrays can be generated given the values of the parameters L and q. A user may also create his own g(t) arrays by whatever means he desires. The specific modulation format to be used is selected by a user by setting the associated array address on lines 182 for that portion of ROM (or RAM) 155 containing the g(t) array members corresponding to the desired modulation format. In four-level modulation format, a g'(t) array must also be loaded into ROM (or RAM) 155 as well as a g(t) array.

The premodulation filter characteristics (i.e., the type of modulation format) may be changed very rapidly by switching between different g(t) arrays stored in ROM (or RAM) 155. If ROM is used, it must be loaded externally prior to assembly. In the preferred embodiment, RAM is utilized rather than ROM to allow not only switching between pre-loaded g(t) arrays, but also to allow dynamic loading of g(t) arrays and custom tailoring of g(t) arrays. Switching between g(t) arrays may be done by dynamic control of the array address lines 182 via controller 185 or by an external controller (not shown).

Referring to FIGS. 4 and 6 and Table 5, the apparatus to perform two-level modulation operates as follows: A serial non-return-to-zero (NRZ) data stream is input on line 154. A data converter 158 converts the NRZ data stream to binary digits which represent a bimodal impulse stream. Logical 1's correspond to bimodal data impulses of value +1 and logical 0's correspond to bimodal data impulses of value −1. Shift register 162 is a 15 cell (bit) long one cell (bit) wide serial input, parallel output shift register which is clocked by the data clock on line 156. For each data clock pulse, the NRZ input data stream present in shift register 162 is shifted one cell (corresponding to data clock period T) to the right and index (m+n) is incremented by one. The 15 parallel output lines 160 of shift register 162 are input to a multiplexer 161. Four address lines 157 from math state machine 153 control which of the 15 output lines 160 are selected to be on the +/− select line 164. The logical value of the +/− select line 164, and therefore the logical value (denoted by D(m+n) in Table 5) of the NRZ data bit present in the selected shift register 162 cell, determines whether adder 163 adds or subtracts the selected g(t) array member value present on lines 170 from the current accumulator 165 value present on lines 166. Once per data clock subinterval time period, the accumulator 165 is updated. Both sets of lines 170 and 166 are 16 bit wide binary data buses.

The math state machine 153 is clocked by an asynchronous Int Clk on line 152 which operates at a much higher rate than the xq clock 159 and generates a portion of the ROM (or RAM) 155 address on lines 157 for each g(t) array element of the selected g(t) modulation format array. This portion of the ROM (or RAM) 155 address selects the particular data clock cell (T) from which g(t) array members are to be selected. For example, in Table 5 and FIG. 4, NRZ data bit D(m+4) corresponds to g(t) members g(1), g(2), g(3) and g(4) during successive convolution subinterval periods t1, t2, t3 and t4, respectively, and are all selected by a single address on lines 157. During any one convolution cycle, address lines 157 are incremented to select g(t) members from ROM (or RAM) 155 and corresponding NRZ data bits from shift register 162. As mentioned previously g(t) is divided into parameter L data clock intervals (maximum 15 due to 4 address lines) which corresponds to the maximum address which will be present on lines 157.

The sample address state machine 151 is clocked by the xq clock 159 and generates another portion of the ROM (or RAM) 155 address on lines 150 for each g(t) array elements of the selected g(t) modulation format array. This portion of the ROM (or RAM) 155 address selects g(t) array members with the same relative position within each data clock cell T. For example, in FIG. 4, g(1), g(5), g(9), g(13), g(17), g(21) and g(25) are all selected with the same value on address lines 150. During any one convolution cycle, this address is held constant as is illustrated in Table 5 during subinterval time period $t=t1$, and is incremented for successive convolution cycles at subinterval periods t2, t3 and t4. The maximum address which will present on lines 150 corresponds to q, which is the number of data clock subinterval periods/data clock period.

The convolution algorithm follows the process previously described in Table 5. The initial value contained in Accum(t) is set by Initial Bias Value block 172. In the preferred embodiment, this is set to a value which corresponds to a value midway in the dynamic range of the accumulator 165. The accumulator 165 is set to this initial bias value preceding every convolution cycle via control from the Math State machine 153.

The output of the accumulator 165 is coupled to latch 167 which is latched after every convolution cycle by the xq clock 159. The output of latch 167 is coupled to DAC 168 where it is converted to an analog signal smoothed by the analog reconstruction filter 169 to reduce spurious signals. The output of the analog reconstruction filter 169 on line 171 is coupled to the particular modulator 13 (shown in FIG. 1) being used in the system. An alternative to the analog output is the parallel digital output data bus 173 from the latch 167. This data bus is used in systems such as shown in FIG. 2 which require a digital input.

The preferred embodiment, as implemented, uses 16 bit resolution in the convolution process with 12 bits being sent to latch 167 and the DAC 168. The reconstruction filter 169 reduces spurious frequency output from the DAC 168 due to digital quantization noise and sampling aliasing. In the preferred embodiment, the reconstruction filter 169 is a linear phase (constant group delay) analog filter having a selectable cutoff frequency over a wide range of data rates as dictated by the xq data clock 159 rate.

Now referring to FIGS. 5 and 7 and Table 6, the apparatus to perform four-level modulation operates just as described for two-level modulation, with the following modifications: Switches 178 and 179 will allow the apparatus in FIG. 7 to operate either in four- or two-level operation. When switches 178 and 179 are in the two-level mode, the apparatus in FIG. 7 reduces to the apparatus in FIG. 6.

A serial NRZ data stream is input to switch 178 and to a two-to-four bit coder 177 where pairs of serial input data bits are coded into two parallel bits on data lines 190 and 192. Data line 192 is the data input for shift register 162. Shift register 162 and multiplexer 161 operate as in two-level modulation operation where +/− control line 164 determines whether adder 163 adds or subtracts. Data line 190 is the data input for shift register 175 and multiplexer 173 which operate similarly to shift register 162 and multiplexer 161; control line 176 is an address line for ROM (or RAM) 155.

Both g(t) and g'(t) arrays are stored in ROM (or RAM) 155. Address line 176 controls which array is addressed. Providing the remaining address lines 182, 150 and 157 remain constant, address line 176 will select g(t) or g'(t) array members corresponding to the same data clock subinterval, t1, t2, t3, etc.

Referring to Table 2 and FIG. 7, the first of the two serial logical input bits is embodied in data line 192. The logical level of data line 192 represents the sign of the binary number which represents the corresponding bimodal data impulse. The second of the two serial logical input data bits is embodied in data line 190. The logical level of data line 190 represents the magnitude of the binary number which represents the corresponding bimodal data impulse. The convolution algorithm follows the process previously described in Table 6.

We claim:

1. Apparatus providing a modulation signal for modulating a carrier signal, said apparatus comprising:
   a programmable digital filter having a finite impulse response defined by a response function g(t) wherein g(t) represents the impulse response corresponding to a selectable modulation format, said programmable digital filter responsive to a digital data input signal for generating said modulation signal;
   memory means coupled to said programmable digital filter for storing a plurality of arrays of filter coefficients, each of said plurality of arrays defining a different, selectable response function g(t) associated with a different, selectable modulation format; and
   control means coupled to said programmable digital filter and to said memory means for selecting a desired one of said plurality of arrays and for programming said programmable digital filter to have a finite impulse response defined by the impulse response function g(t) corresponding to said desired array.

2. Apparatus as in claim 1 further comprising:
   a digital-to-analog converter coupled to said programmable digital filter for converting said modulation signal to an analog signal representing said modulating signal; and
   an analog filter coupled to said digital-to-analog converter for filtering said analog signal.

3. Apparatus as in claim 1 wherein each of said arrays of filter coefficients comprise an array of numerical values determined by evaluating said corresponding response function g(t) at each of a plurality of sampling points.

4. Apparatus as in claim 3 further comprising signal converter means connected to intercept the digital data input signal prior to receipt of said input signal by said programmable digital filter for converting said digital data input signal into a digital signal representing a series of bimodal impulses having positive and negative amplitudes.

5. Apparatus as in claim 4 wherein said programmable digital filter comprises:
   summing means responsive to said digital signal for summing said filter coefficients defining a selected response function g(t), each of said numerical values corresponding to a discrete impulse represented by said digital signal and being added when said corresponding impulse has a positive amplitude and being subtracted when said corresponding impulse has a negative amplitude;

accumulator means coupled to said summing means for accumulating the sum of said numerical values, said accumulator responsive to a first clock signal to update said sum every first clock period; and latch means coupled to said accumulator means and responsive to a second clock signal for latching said sum and outputting said sum every second clock period.

6. Apparatus as in claim 5 further comprising:

shift register means having a serial input and a plurality of parallel outputs, said serial input coupled to said signal converter means for receiving said digital signal, said shift register means having a plurality of storage cells and responsive to a third clock signal for shifting said digital signal one cell for each third clock period, each one of said parallel outputs connected to a different one of said storage cells; and multiplexer means coupled to said plurality of parallel outputs and to said control means and to said summing means, responsive to said first clock signal to couple the digital signal present in each storage cell, one at a time, to said summing means, said first clock signal having a frequency greater than said second clock signal frequency and said third clock signal frequency, said second clock signal frequency being greater than said third clock signal frequency and being an integral multiple of said third clock frequency.

7. Apparatus as in claim 6 further comprising:

a digital-to-analog converter coupled to said latch for converting said sum to an analog signal representative of said modulation signal; and an analog filter coupled to said digital-to-analog converter for filtering said analog signal.

8. A programmable digital premodulation filter having an impulse response providing a modulation signal for modulating a carrier signal with a digital data signal, said digital premodulation filter comprising:

memory means for storing a plurality of arrays of filter coefficients, each of said plurality of arrays defining a different, selectable impulse response function g(t) corresponding to a different one of a plurality of modulation formats;

summing means coupled to said memory means and responsive to said digital data signal for summing said filter coefficients;

accumulator means coupled to said summing means for accumulating the sum of said filter coefficients, said accumulator means responsive to a first clock signal for updating the accumulator contents once each first clock period;

latch means coupled to said accumulator means and responsive to a second clock signal for latching said sum and outputting said sum every second clock period, the frequency of said first clock signal being greater than the frequency of said second clock signal; and control means coupled to said memory means and to said summing means for selecting a desired one of said plurality of arrays of filter coefficients and for programming said summing means such that said digital premodulation filter has a response defined by the impulse response function g(t) corresponding to said selected array of filter coefficients.

9. Apparatus as in claim 8 further comprising:

a digital-to-analog converter coupled to said latching means for converting said sum to an analog signal representative of said modulation signal; and an analog filter coupled to said digital-to-analog converter for filtering said analog signal.

10. Apparatus as in claim 9 wherein said analog filter comprises a linear phase analog filter having a selectable cutoff frequency.

11. Apparatus as in claim 8 wherein said memory means comprises a RAM, said RAM having dynamic input means for real time loading of arrays of filter coefficients defining desired impulse functions g(t) and for dynamically reprogramming said summing means, said control means including means for modifying said arrays of filter coefficients stored in said RAM.

12. Apparatus as in claim 8 further comprising:

signal converter means connected to intercept said digital data signal prior to receipt of said digital data signal by said summing means for converting said digital data signal into a digital signal representing a series of bimodal impulses having positive and negative amplitudes;

shift register means having a serial input and a plurality of parallel output lines, said serial input coupled to said signal converter means for receiving said digital signal, said shift register means having a plurality of storage cells and responsive to a data clock signal for shifting said digital signal one cell for each data clock period, each of said parallel output lines connected to a different one of said storage cells; and multiplexer means coupled to said plurality of parallel output lines and to said control means and to said summing means, responsive to said first clock signal to successively couple the digital signal stored in each storage cell to said summing means, said first clock signal having a frequency greater than said data clock signal frequency, said summing means adding the filter coefficient to said sum when said bimodal impulse has a positive amplitude and subtracting the filter coefficient from said sum when said bimodal impulse has a negative amplitude.

13. Apparatus as in claim 12 wherein each of said arrays of filter coefficients stored in said memory means comprise an array of numerical values determining by evaluating said corresponding impulse response function g(t) at each of a plurality of predetermined sampling points.

14. Apparatus for modulating a carrier signal with a digital data signal comprising:

input means for receiving said digital data signal and converting said digital data signal into a digital signal representing a series of bimodal impulses having positive and negative amplitudes;

memory means for storing a plurality of arrays of numerical values, each of said plurality of arrays defining a different, selectable impulse response function g(t) corresponding to a different one of a plurality of modulation formats;

summing means coupled to said memory means and to said input means and responsive to said digital signal for summing said numerical values representing a selected impulse response function g(t);

accumulator means coupled to said summing means for accumulating the sum of said numerical values, said accumulator means responsive to a first clock signal for updating the accumulator contents once each first clock period;

output means coupled to said accumulator means and responsive to a second clock signal for latching said sum every second clock period, the frequency of said first clock signal being greater than the frequency of said second clock signal, said output means outputting a modulation signal, said modulation signal a function of said sum;

carrier generation means for providing a carrier signal;

modulator means coupled to said output means and to said carrier generation means responsive to said modulation signal to provide a modulated carrier signal; and control means coupled to said memory means and said summing means and to said input means for selecting a desired one of said plurality of arrays of numerical values and for programming said summing means to have an impulse response defined by the impulse response function g(t) corresponding to said selected array of numerical values.

15. Apparatus as in claim 14 wherein said input means comprises:

signal converter means for converting said digital data signal into said digital signal;

shift register means having a serial input and a plurality of parallel output lines, said serial input coupled to said signal converter, said shift register means having a plurality of storage cells and responsive to a data clock signal for shifting said digital signal one storage cell for each data clock signal period, each of said parallel output lines connected to a different one of said plurality of storage cells; and multiplexer means coupled to said plurality of parallel output lines and to said control means and to said summing means, responsive to said first clock signal to successively couple the digital signal stored in each storage cell to said summing means, said first clock signal having a frequency greater than said data clock signal frequency, said summing means adding the corresponding numerical value to said sum when said bimodal impulse has a positive amplitude and subtracting a corresponding numerical value from said sum when said bimodal impulse has a negative value.

16. Apparatus as in claim 15 further comprising biasing means coupled to said control means and to said summing means for initializing said accumulator contents at the beginning of each data clock signal period.

17. Apparatus as in claim 14 wherein said carrier generator means provides a first and a second carrier signal in phase quadrature with each other.

* * * * *